(12) United States Patent
Akita

(10) Patent No.: US 7,746,163 B2
(45) Date of Patent: Jun. 29, 2010

(54) STABILIZED DC POWER SUPPLY CIRCUIT

(75) Inventor: Shinichi Akita, Tokyo (JP)

(73) Assignee: Nanopower Solutions, Inc., Tokyo (JP)

( * ) Notice: Subject to any disclaimer, the term of this patent is extended or adjusted under 35 U.S.C. 154(b) by 185 days.

(21) Appl. No.: 11/667,396

(22) PCT Filed: Nov. 15, 2004

(86) PCT No.: PCT/JP2004/016960

§ 371 (c)(1), (2), (4) Date: Nov. 16, 2007

(87) PCT Pub. No.: WO2006/051615

PCT Pub. Date: May 18, 2006

(65) Prior Publication Data

US 2008/0122528 A1 May 29, 2008

(51) Int. Cl.
*G05F 1/10* (2006.01)

(52) U.S. Cl. ........................ 327/541; 327/538; 327/543

(58) Field of Classification Search ................ 327/530, 327/535, 537, 538, 540, 541, 543; 323/277, 323/280, 281
See application file for complete search history.

(56) References Cited

U.S. PATENT DOCUMENTS

| | | | | |
|---|---|---|---|---|
| 3,771,040 A | 11/1973 | Fletcher et al. | ................ | 321/2 |
| 5,436,552 A | 7/1995 | Kajimoto | .................... | 323/313 |
| 5,872,429 A | 2/1999 | Xia et al. | .................... | 315/194 |
| 6,046,624 A | 4/2000 | Nam et al. | ................... | 327/530 |
| 6,246,221 B1 | 6/2001 | Xi | .............................. | 323/280 |
| 6,304,131 B1 * | 10/2001 | Huggins et al. | ............. | 327/538 |
| 6,522,111 B2 | 2/2003 | Zadeh | ......................... | 323/277 |
| 6,933,772 B1 * | 8/2005 | Banerjee et al. | ............. | 327/541 |
| 7,030,595 B2 * | 4/2006 | Akita | ......................... | 323/280 |

FOREIGN PATENT DOCUMENTS

| | | |
|---|---|---|
| JP | 10188557 | 7/1998 |
| JP | 2001-34351 | 2/2001 |
| JP | 2001-75663 | 3/2003 |
| JP | 2003330550 | 11/2003 |
| JP | 2004-240822 | 8/2004 |
| JP | 2004240646 | 8/2004 |
| JP | 2004240822 | 8/2004 |
| JP | 2004310541 | 11/2004 |
| WO | WO 03/091817 | 11/2003 |
| WO | WO2006/051615 | 5/2006 |

OTHER PUBLICATIONS

Supplementary European Search Report dated Dec. 27, 2008 based on EP 04822407.5.
International Search Report dated Apr. 12, 2005 based on PCT Application No. PCT/JP2004/016960.

* cited by examiner

*Primary Examiner*—Hai L Nguyen
(74) *Attorney, Agent, or Firm*—Ohlandt, Greeley, Ruggiero & Perle, L.L.P

(57) ABSTRACT

A stabilized DC power supply circuit comprises an error amplifier circuit, an output amplifier circuit, an output voltage division circuit, and a reference voltage circuit. A bias current boost circuit capable of stabilized operation is added to the DC power supply circuit. Since the feedback loop of the bias current boost circuit is provided with a hysteresis function or an artificial hysteresis function by a large delay element, it is possible to adaptively control bias current without sacrifice of stability and realize a stabilized DC power supply circuit exhibiting high response and high stability with low current consumption.

4 Claims, 15 Drawing Sheets

STABILIZED DC POWER SUPPLY CIRCUIT

TECHNICAL FIELD

The present invention relates primarily to a stabilized DC power supply circuit. In particular, it relates to a highly stable adaptively controlled stabilized DC power supply circuit that has quick response under low operation current.

BACKGROUND ART

Multiple stabilized DC power supply circuits are applied in portable electronic devices, as well as other so-called electronic equipments. Power supply circuits whose characteristics adapt to different purposes are used for digital circuits, high-frequency circuits, analog circuits, and the like. In case of a cellular phone, a very high power supply ripple rejection is required for a RF transmitting circuit because poor ripple rejection results in poor clearness of voice conversation. Power supply ripple noise has a detrimental effect on the error rate, even in the case of wireless communications means whereby information is converted to digital code and transmitted and received, because the carrier signals are subjected to analog modulation and demodulation during transmission and reception. An operating current of 100 µA, which is sufficient for realizing a ripple elimination rate, for instance, of −80 db, is possible with conventional portable telephones. However, the newest trend in portable telephones is the improvement of overall power supply efficiency by splitting the inside of the device into many blocks and supplying power to each block, in order to prolong battery life. In short, the newest trend in portable telephones involves a plurality of power supply circuits loaded in one device so that the operating current of each power supply circuit is strictly curtailed.

It is estimated that several billion electronic devices operate throughout the world today. In this connection, assuming that one power supply circuit operates at 200 µA, a current of 1,000 kA is passed by 5 billion circuits, and assuming that these operate at 3 V, 3,000 kW of power are being consumed.

The prior art and the circuit theory on which this art is based are described below with reference to the figures.

(1) Example of Conventional Circuit

FIG. 1 shows a block diagram of a conventional DC power supply circuit with adaptively controlled bias. FIG. 2 shows a circuit diagram of a conventional DC power supply circuit with adaptively controlled bias. Vdd (VDD) and Vss (VSS) in FIG. 1 are the power supply terminals.

The conventional DC power supply circuit with adaptively controlled bias shown in FIGS. 1 and 2 comprises a differential amplifier U41, an output amplifier U42, an output voltage dividing circuit U43, a reference voltage circuit U44, and a bias current boost circuit U45.

Differential amplifier U41 operates such that it amplifies the difference in voltage between reference voltage circuit U44 and voltage dividing circuit U43 and applies that voltage to output circuit U42 to control an output transistor P43 of output circuit U42 and causes a constant output voltage Vout to be output. RL in FIGS. 1 and 2 is a load resistance. Load resistance RL takes in a current of several 100 mA. Moreover, C3 is an output decoupling capacitor. Together with an equivalent series resistance Resr, output decoupling capacitor C3 participates closely in the stabilization of this DC power supply circuit. Bias current boost circuit U45 operates such that it increases the operating bias current of differential amplifier U41 when load current first begins to flow and thus improves the stability, the response speed, and the ripple noise elimination rate. In essence, when no load current is flowing to the power supply circuit, the system operates at the minimum operating current, and when load current is flowing, the bias current is increased and a stable, efficient operation of the power supply circuit is realized. The load current at which the boost starts is settable by the size ratio between transistor P45 and N47, and is usually set to a small load current region that is not frequently used.

(2) Theoretical Explanation of Conventional Circuit

The output voltage will now be subjected to theoretical study. Output voltage Vout is represented by the following formula.

$$\text{Vout} = \text{Vref} \times (Av/1 + K \times Av) + S_0 \quad (1)$$

Where, Vref is the reference voltage, AV is the voltage gain of differential amplifier U41, K is the voltage dividing ratio of voltage dividing circuit U43, and $S_0$ is the system offset voltage of differential amplifier U41.

Reference voltage Vref is affected by changes in power supply voltage VDD; therefore, the percentage change thereof is represented by the power supply voltage coefficient of Vref, or $\Delta \text{Vref} = (\delta \text{Vref}/\delta v)/K$.

K is the voltage dividing ratio of the output voltage dividing resistance; therefore, K<1, and unless ripple ΔVref that accompanies Vref is eliminated by a filter, it is impossible to obtain a good PSPR (power supply rejection ratio; this is the ratio at which the output has changed when the power supply has changed by, for instance, 1V. For example, if the output changes by 1 mV, PSPR becomes 1 mV/1V, in essence, −60 dB.). However, the ripple of Vref is contained in frequencies ranging from very low to high frequencies; therefore, a large time constant is needed for filtering, and it is impossible to integrate filters for eliminating ripple over the entire frequency range on the same semiconductor chip.

The voltage dividing ratio K is represented by the following formula:

$$K = R1/R1 + R2$$

When each resister R1 and R2 is fabricated with a poly silicon material, the supply voltage dependency is negligible small. Therefore, it is assumed that the percentage change in the VDD is not taken into consideration. The value of K is the voltage dividing value that determines the output voltage. Vref is generally from 0.2 to 0.8; therefore, very small values and very large values is not settable. Therefore it contributes to ripple rejection slightly.

$S_0$ in formula (1) represents the system-offset voltage and is inevitable because of the circuit structure. $S_0$ is a new concept that was assumed to be present based on experimental values. It has been experimentally shown that VDD does have an effect, and generally has a positive coefficient. However, making this coefficient a negative value has an important effect on formula (1).

The power supply voltage coefficient $\Delta S_0$ of $S_0$ is represented by $\Delta S_0 = \delta S_0/\delta_v$.

Av is the open loop gain under the amplification rate of the entire circuit, and is, of course, dependent on the power supply voltage VDD; therefore, the percentage change is represented by the following differential equation:

$$Av = (\delta Av/\delta v)/(1 + KAv)^2.$$

The ripple component is represented by the following formula (2):

$$\Delta \text{Vout} = \Delta \text{Vref} + \text{Vref} \times Av + \Delta S_0 \quad (2)$$

Voltage gain AV will now be subjected to theoretical study.

Differential amplifier U41 in FIG. 2 is divided into first amplification circuit U41-1 and second amplification circuit U41-2, and output amplification circuit U42 is regarded as the third amplification circuit. The voltage gain of the first, second, and third amplification circuits is Av1, Av2, and Av3, respectively.

The power supply gain Av is represented by Av=Av1× Av2×Av3.

The power supply gain Avi of the $i^{th}$ amplification circuit is represented by Avi=Gmi×Zoi.

Here, Gmi and Zoi represent the conductance and output impedance of the $i^{th}$ amplification circuit.

Output impedance Zoi is equal to the parallel impedance of output resistance Rpi of the P channel FET of the $i^{th}$ amplification circuit, output resistance Rni of the N channel FET of the $i^{th}$ amplification circuit, and the capacity component Coi of the output of the $i^{th}$ amplification circuit. In the case of the circuit structure shown in FIG. 2, P41 and P42 pertain to the P channel FET of the first amplification circuit U41-1, and N41 pertains to the N channel FET of the first amplification circuit U41-1. Similarly, P44 pertains to the P channel FET of the second amplification circuit U41-2, and N44 pertains to the N channel FET of the second amplification circuit U41-2. Moreover, P43 pertains to the P channel FET of the third amplification circuit U42.

The output resistance Rpi of the P channel FET of the $i^{th}$ amplification circuit is represented by formula (3).

$$Rpi=\alpha(Li/Idi)\sqrt{(Vgdi+Vtpi)} \quad (3)$$

Here, α is the correction coefficient. The value of α is generally $5\times10^6 \sqrt{V/M}$.

The conductance Gmi of the $i^{th}$ amplification circuit is represented by formula (4).

$$Gmi=\sqrt{\{2\mu p\ Cox(Wi/Li)Idi\}} \quad (4)$$

Here, μp, Cox, Wi, Li, and Idi are the P channel FET carrier mobility, gate oxide film unit capacity, and transistor i channel width, channel length, and drain current.

The frequency characteristics will now be discussed.

The first, second, and third amplification circuits have a pole at a frequency Fpi represented by formula (5).

$$Fpi=1/2\pi\times Zoi \quad (5)$$

The gain of the amplification circuit of each stage begins to roll-off by a ratio of −6 db/octave and the phase delay appears at the pole frequency Fpi.

It is clear from the results of the above-mentioned that according to formulas (3) and (4) with respect to the output resistance Rpi and the conductance Gmi, the gain increases with an increase in the operating current Idi of each amplification circuit, and that the desired characteristics are obtained with respect to the ripple elimination rate from formula (1). Moreover, according to formulas (5) and (3), the pole frequency Fpi increases with an increase in the operating current IDi and is settable freely, and the phase can be delayed to improve stability. In short, as a result, the desired characteristics with respect to a stabilized DC power supply are obtained with a higher operating current Idi.

However, increasing the operating current limitlessly, the larger total current consumption of the equipment leads to a reduction in battery life and a reduction in energy efficiency. Thus, there is a huge need for a bias current boost-type power supply circuit with which the operating current decreases at no load and the operating current increases at loaded.

(3) Problems with the Prior Art

Many technologies for adaptive control of bias current have been proposed. Examples of patent references relating to this type of technology are JP Unexamined Patent Publication (Kokai) 2001-75,663, JP Unexamined Patent Publication (Kokai) 2001-34,351, JP Unexamined Patent Publication (Kokai) 3-158,912, and U.S. Pat. No. 6,522,111 B2.

The basic structure of a conventional adaptive control circuit as cited in these references is one wherein the voltage output of an error amplifier is converted to current, and fed back as a control current proportional to the output current. A major problem with these conventional adaptive control circuits is the unstable operation or oscillation caused by positive feedback. A feedback circuit having a positive feedback loop oscillates when the gain of the feedback loop is 1 or higher. None of the prior technologies cited in the above-mentioned references solves this essential problem. Conditions under which oscillation occurs are present in each of the prior technologies and none can be put to practical use.

FIG. 3 is a graph showing the results of a simulation of the phase gain curve of the bias current feedback loop under various loads. Specifically, the results are from an AC analysis when the P45 gate of the circuit in FIG. 2 was AC blocked. Gain curves 100, 101, and 102 and phase curves 103, 104, and 105 in FIG. 3 represent the curves when the load resistance RL is 200, 500, and 5 kΩ respectively. Curve 101 exceeds a gain of 1 and the phase of curve 104 changes by 180° or more; therefore, it is clear that conditions under which oscillation occurs are generated. The above-mentioned oscillation condition shifts when the circuit constant in FIG. 2 is changed. Incidentally, the oscillation condition shifts in the direction of a large load current as the channel length of P45 increases. The range of the oscillation condition becomes broader with a reduction in the capacity of output capacitor C3.

FIG. 4 is the waveform diagram showing the results of a transient response analysis from the input power supply. FIG. 4 shows that in the transient response analysis, the output PD node of differential amplifier U41 oscillates under a frequency near the peak of gain curve 101. The conventional circuit in FIG. 2 always exhibits unstable operating conditions in response to load current unless the gain of the feedback loop is 1 or less. It is a self-evident that when the gain of the feedback loop is 1 or less, the original bias current boost function is lost, which is the same as having no boost circuit.

FIG. 5 is another conventional example of a DC power supply circuit with adaptively controlled bias. This example differs from the structure of the power supply circuit in FIG. 2 in that differential amplifier U51 consists of one differential circuit. Differential amplifier U51 comprises fewer amplification steps; therefore, the gain of the feedback loop can be set smaller and the oscillation condition can be reduced, although it cannot be completely eliminated. In contrast to the example in FIG. 2, the range of the oscillation condition becomes broader as the output capacitor C3 becomes larger.

DISCLOSURE OF INVENTION

Problems to be Solved by the Invention

An object of the present invention is to provide a highly stabilized DC power supply circuit that makes possible adaptive control of a bias current without sacrificing stability, and that has a fast response speed under low operation current.

Means for Solving Problems

In order to accomplish the above-mentioned object, the stabilized DC power supply circuit of the present invention is characterized in having, between first and second electrode terminals, which introduce power supply voltage, a reference voltage generating circuit, which generates a reference voltage; a differential amplifier, which amplifies the voltage difference from the reference voltage; a voltage current output circuit, which is controlled by the differential amplifier in order to produce a regulated output voltage; an output voltage dividing circuit, which detects output voltage changes; and a bias current boost circuit, which is controlled by the load current flowing from the voltage current output circuit and is connected to the differential amplifier, wherein the bias current boost circuit comprises an inverse amplification circuit exhibiting hysteresis; a first bias current generating circuit, which always supplies constant current; and a second bias current generating circuit, which is controlled by the inverse amplification circuit exhibiting hysteresis, and is designed such that the load current under which the second bias current generating circuit switches to the non-conducting state is lower than the load circuit under which the second bias current generating circuit is in the conducting state.

Preferably by means of the above-mentioned stabilized DC power supply circuit of the present invention, the inverse amplification circuit exhibiting hysteresis has first and second transistors, which are connected to the output of the differential amplifier; the first and second transistors work with a third transistor to form a first inverter circuit; there is a second inverter circuit formed from a fourth transistor, which is connected to the output of the first inverter circuit, and a constant current power supply; and a fifth transistor connected to the output thereof is also connected to the second transistor.

Moreover, another stabilized DC power supply circuit of the present invention is characterized in having, between first and second electrode terminals, which introduce power supply voltage, a reference voltage generating circuit, which generates a reference voltage; a differential amplifier, which amplifies the voltage difference from the reference voltage; a voltage current output circuit, which is controlled by the differential amplifier in order to produce a stabilized output voltage; an output voltage dividing circuit, which detects output voltage changes; and a bias current boost circuit, which is connected to the differential amplifier, wherein the bias current boost circuit comprises an inverse amplification circuit having a delay circuit; a first bias current generating circuit, which always supplies constant current; and a second bias current generating circuit, which is controlled by the inverse amplification circuit having a delay circuit, and is designed such that the delay time by which the second bias current generating circuit is switched to the non-conducting state is at least ten times greater than the delay time by which the second bias current generating circuit is in the conducting state.

Preferably by means of the stabilized DC power supply circuit of the present invention, the inverse amplification circuit having a delay circuit comprises a first transistor, which is connected to the output of the differential amplifier; the first transistor works with the second transistor to form an inverter circuit; the output of the inverter circuit is connected to a capacitor; and the time constant of the circuit formed by the second transistor and the capacitor is at least ten times the time constant of the circuit formed by the first transistor and the capacitor.

Effect of the Invention

By means of the present invention, a hysteresis function or a pseudo-hysteresis function by a large delay element is added to a feedback loop of a bias current boost circuit that controls the operating stability of the stabilized DC power supply circuit; therefore, a highly stabilized DC power supply circuit is feasible with which the adaptive control of the bias current without sacrificing stability and the response speed is fast under low operation current.

EXPLANATIONS OF LETTERS OR NUMERALS

CC1, CC21, CC31: Capacitor
C3: Output capacitor
I1-I4: Constant current source
I21-I23: Constant current source
I31-I33: Constant current source
P1-P4: P channel MOSFET
P5: P channel MOSFET (first transistor)
P7: P channel MOSFET (second transistor)
P8: P channel MOSFET (fifth transistor)
P21-P24: P channel MOSFET
P25: P channel MOSFET (first transistor)
P31-P33: P channel MOSFET
P35: P channel MOSFET (first transistor)
N1-N4, N6-N8: N channel MOSFET
N5: N channel MOSFET (third transistor)

N9: N channel MOSFET (fourth transistor)
N21-N24, N26-N28: N channel MOSFET
N25: N channel MOSFET (second transistor)
N31-N33, N36-N38: N channel MOSFET
N35: N channel MOSFET (second transistor)
R1, R2: resistors
R21, R22: resistors
R31, R32: resistors
Resr: Equivalent series resistance of output capacitor
RL: Load resistance
U1, U21, U31: Differential amplifier
U2, U22, U32: Output amplifier circuit
U3, U23, U33: Output voltage dividing circuit
U4, U24, U34: Reference voltage circuit
U6, U26, U36: Bias current boost circuit

BEST MODE FOR CARRYING OUT THE INVENTION

Figure 6:
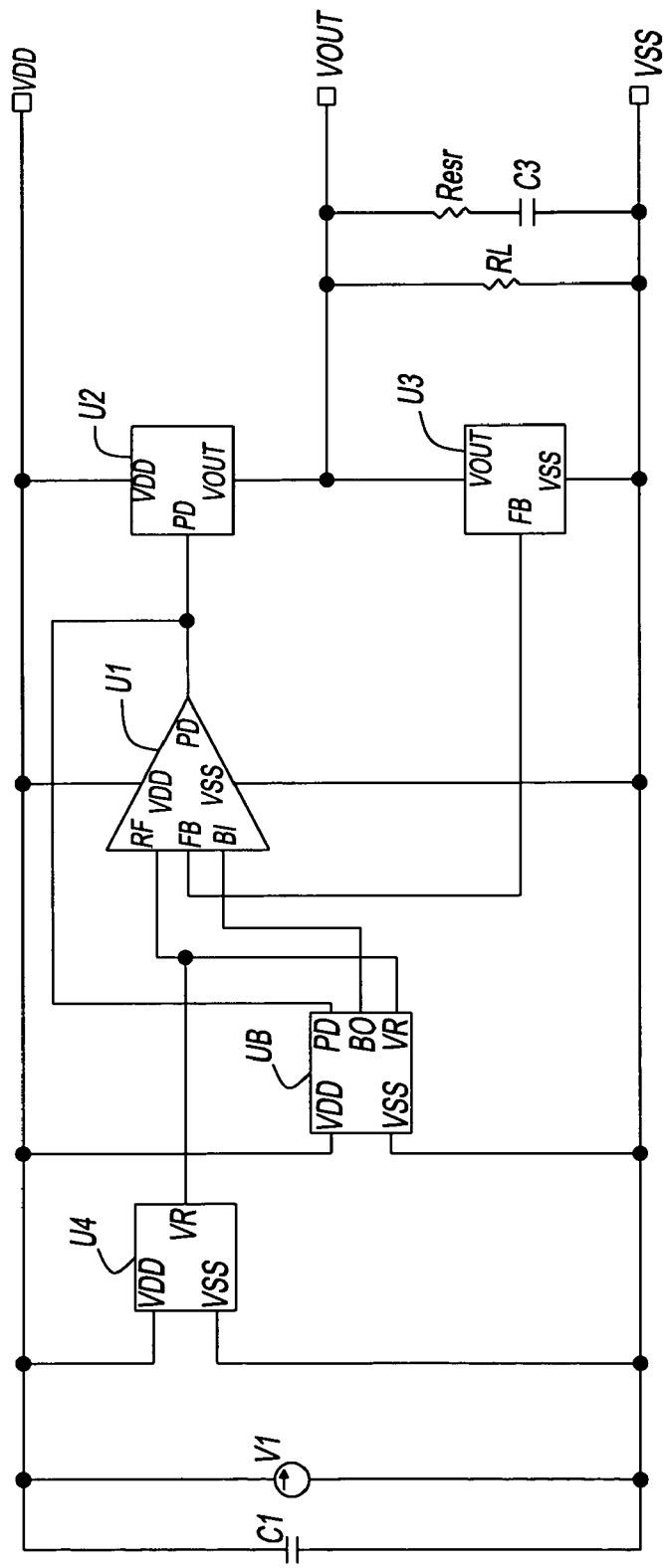
FIG. 6 is a block diagram showing a first embodiment of the stabilized DC power supply circuit of the present invention.
Figure 7:
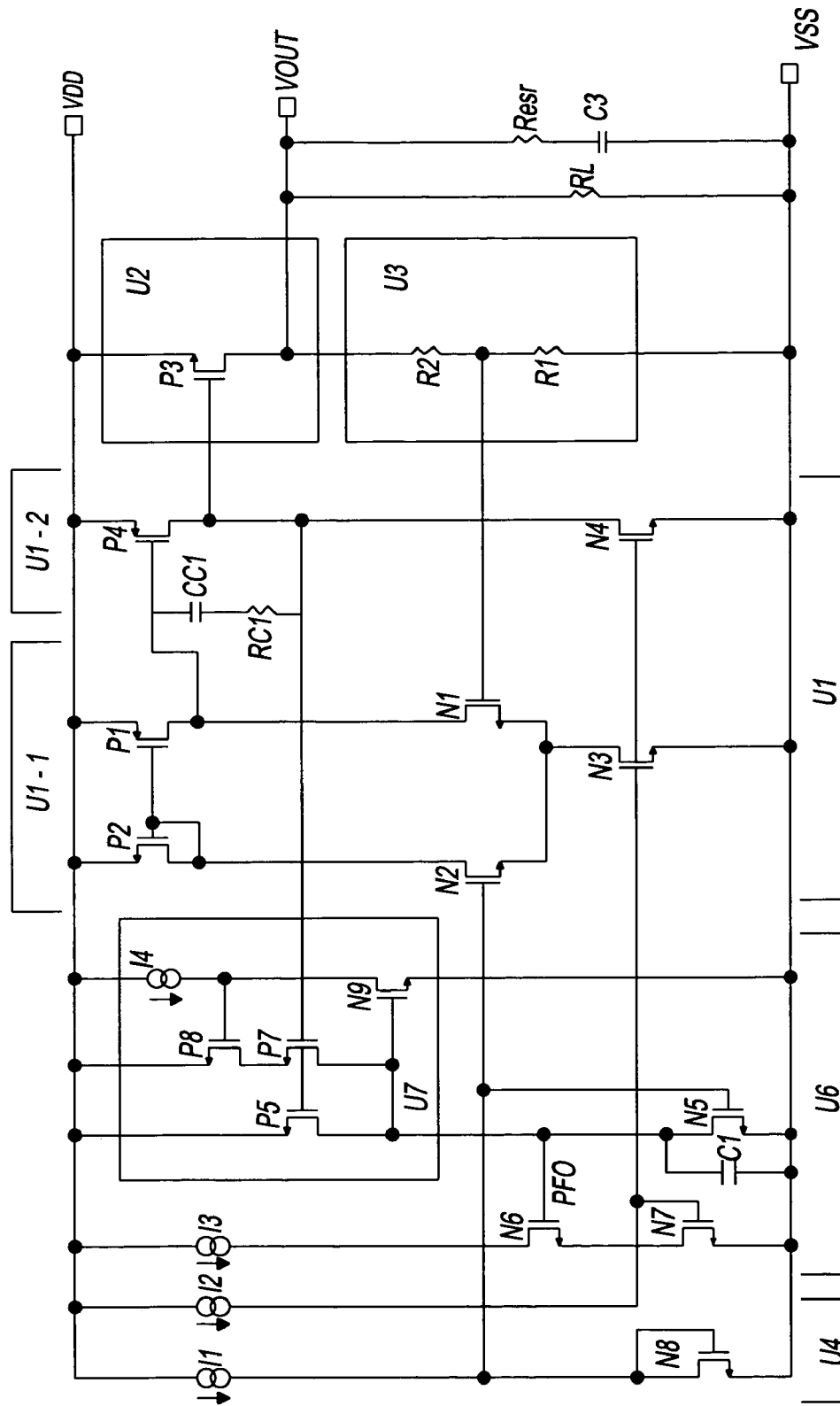
FIG. 7 is a circuit drawing showing a specific circuit structural example of a first embodiment.

FIG. 6 is a block diagram showing a first embodiment of the stabilized DC power supply circuit of the present invention, and FIG. 7 is a circuit diagram showing the specific circuit structure thereof. Vdd (VDD) and Vss (VSS) in FIGS. 6 and 7 are the power supply terminals. Moreover, I1 through I4 in FIG. 7 are the constant current sources, RL is the load resistance, C3 is the output decoupling capacitor, and Resr is the equivalent in-series resistance. Constant current sources I1 through I4 are actually formed from current mirror circuits, Zener diodes, and depression FETs.

Figure 1:
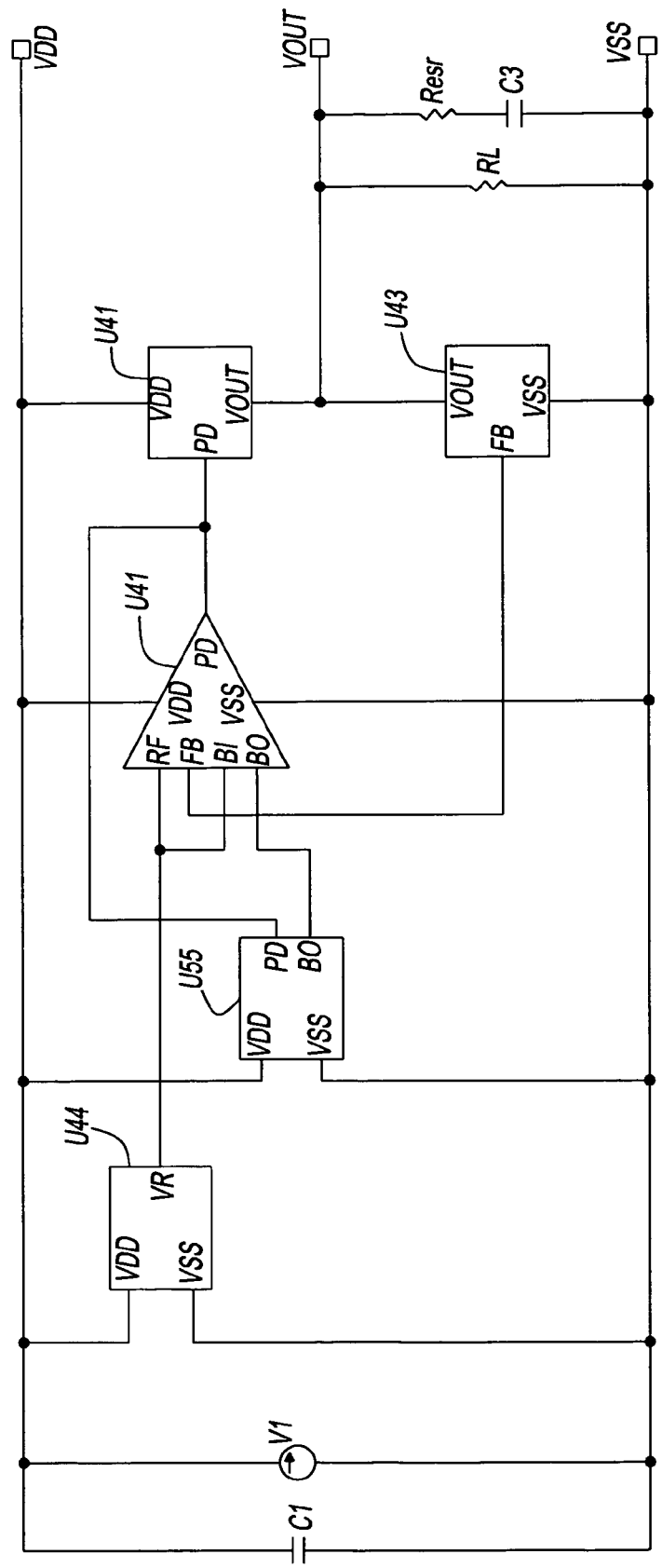
FIG. 1 is a block diagram of a conventional stabilized DC power supply circuit.
Figure 2:
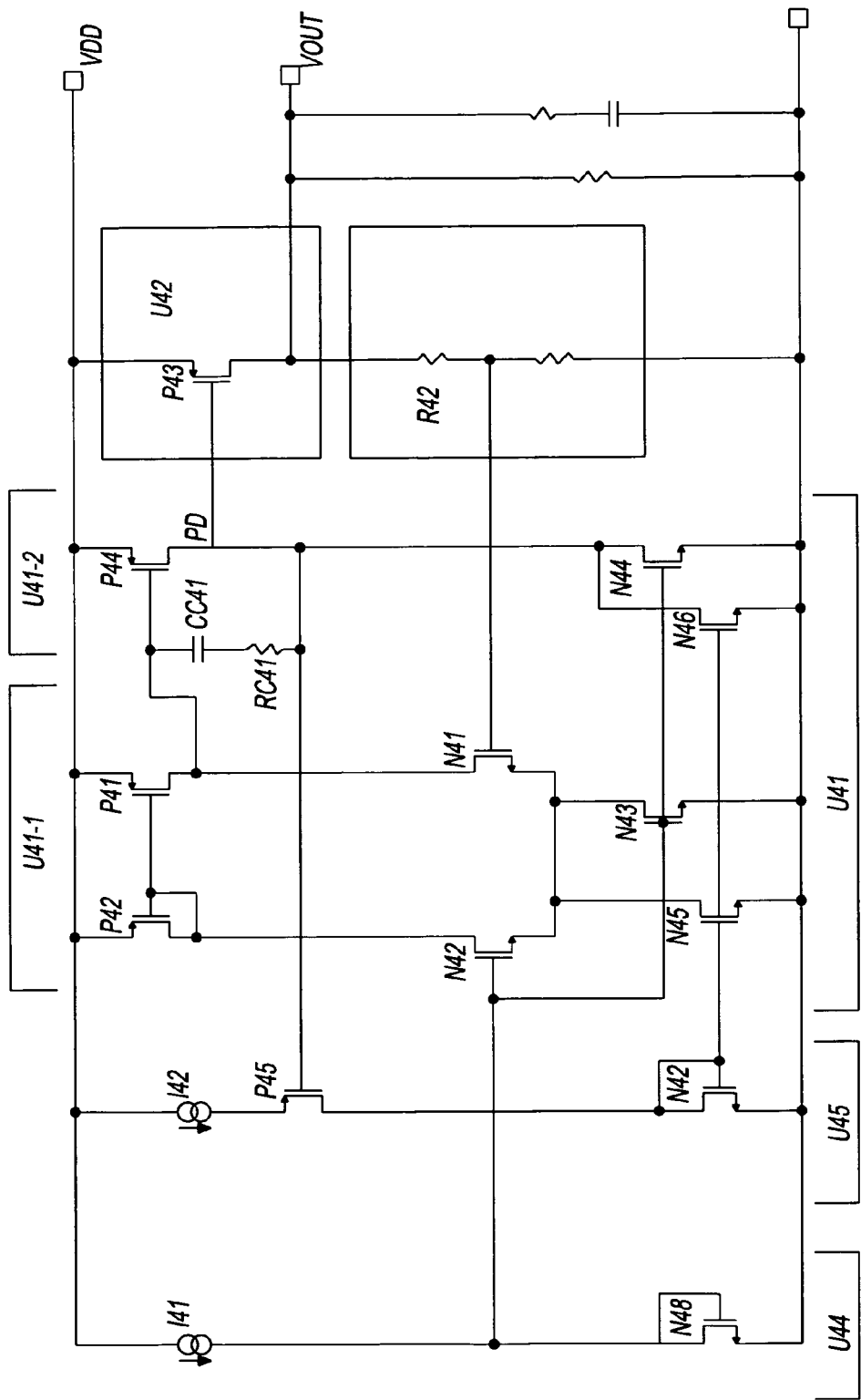
FIG. 2 is a specific circuit diagram of a conventional stabilized DC power supply circuit.
Figure 3:
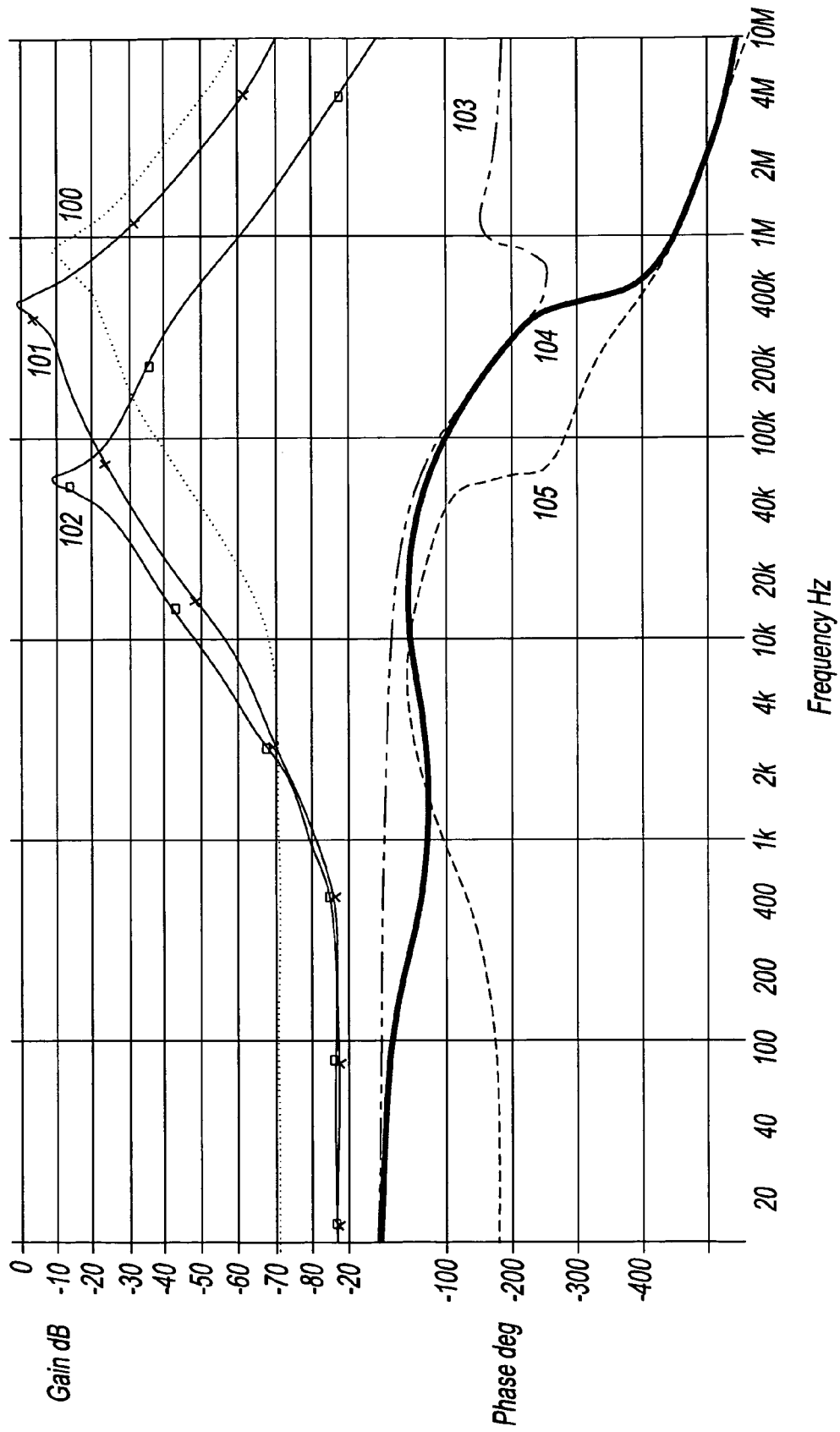
FIG. 3 is a graph showing the results of a simulation of the phase gain curve of the feedback loop of a conventional stabilized DC power supply circuit.
Figure 4:
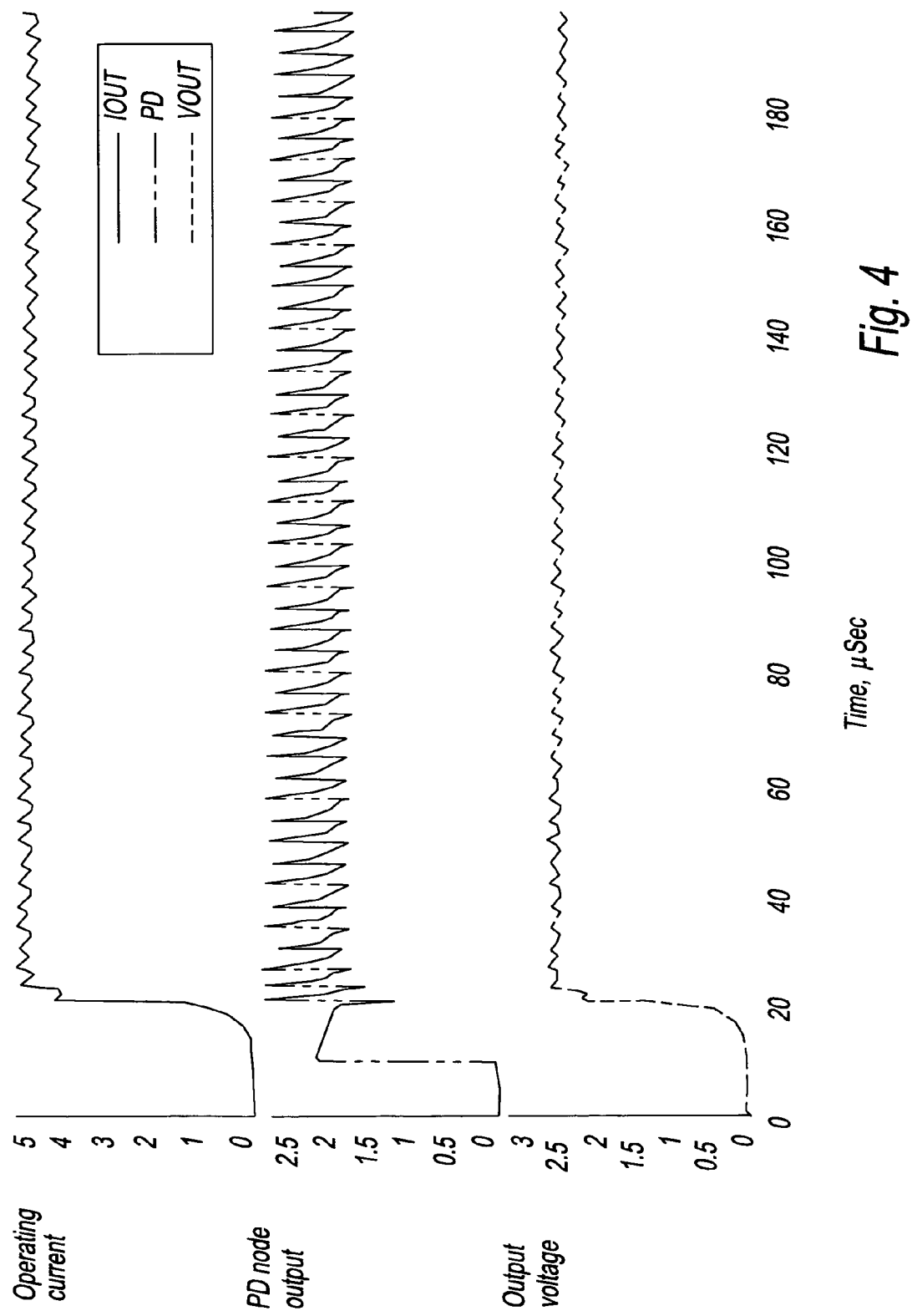
FIG. 4 is a waveform diagram showing the results of a transient response analysis of a conventional stabilized DC power supply circuit.
Figure 5:
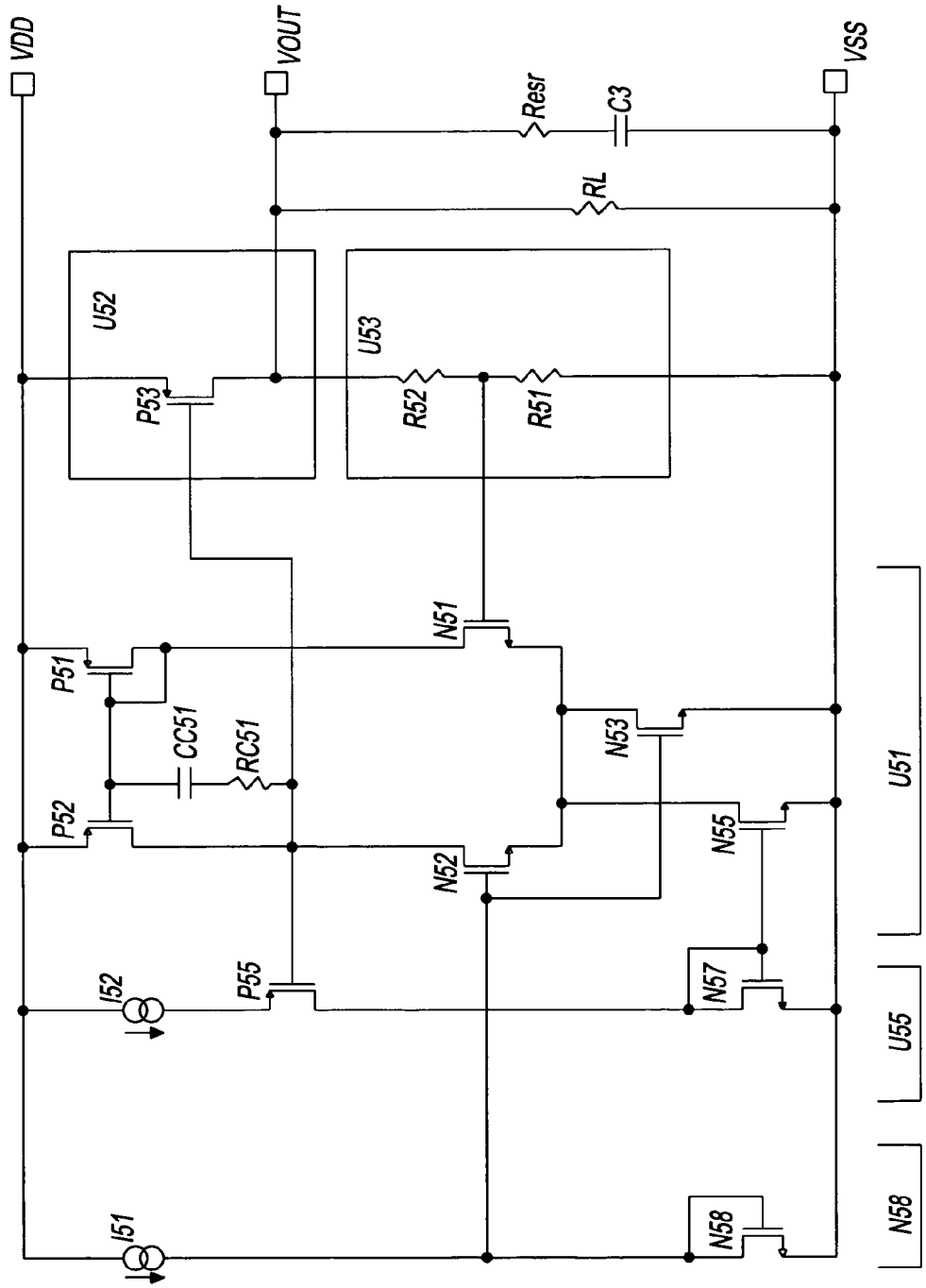
FIG. 5 is a specific circuit diagram of another conventional stabilized DC power supply circuit.

The stabilized DC power supply circuit shown in FIGS. 6 and 7 comprises a differential amplifier U1, an output amplifier circuit U2, an output voltage dividing circuit U3, a reference voltage circuit U4, and an adaptive control bias current boost circuit U6. Of these structural elements, differential amplifier U1, output amplifier circuit U2, output voltage dividing circuit U3, and reference voltage circuit U4 have the same structure as differential amplifier U41, output amplifier circuit U42, output voltage dividing circuit U43, and reference voltage circuit U44 of the conventional power supply circuit shown in FIGS. 1 and 2. In essence, differential amplifier U1 operates in such a way that it amplifies the difference in voltage between reference voltage circuit U4 and voltage dividing circuit U3 and applies that voltage to output circuit U2 to control output transistor P3 of output circuit U2 and causes a constant output voltage Vout to be output. Adaptive control bias current boost circuit U6 operates in accordance with the load current flowing to the RL and increases the bias current of differential amplifier U1.

The specific circuit structure of adaptive control bias current boost circuit U6 in FIG. 6 (transistor circuit) is shown by U6 in FIG. 7. As shown in FIG. 7, adaptive control bias current boost circuit U6 comprises a bias generating circuit consisting of a hysteresis circuit U7, inversion amplifiers N5 to N9, and a constant current source I3.

A first inverter circuit consisting of a P channel MOSFET (first transistor) P5, a P channel MOSFET (second transistor) P7, and an N channel MOSFET (third transistor) N5 as well as a second inverter circuit composed of an N channel MOSFET (fourth transistor) N9 and constant-current source I4 are formed inside adaptive control bias current boost circuit U6. In essence, P channel MOSFET (first transistor) P5 and P channel MOSFET (second transistor) P7 inside hysteresis circuit U7 are connected to the output of differential amplifier U1, and work together with the N channel MOSFET (third transistor) N5 outside hysteresis circuit U7 to form the first inverter circuit. Moreover, the output of the first inverter circuit is connected to P channel MOSFET (second transistor) P7 of the second inverter circuit via a P channel MOSFET (fifth transistor) P8.

Figure 8:
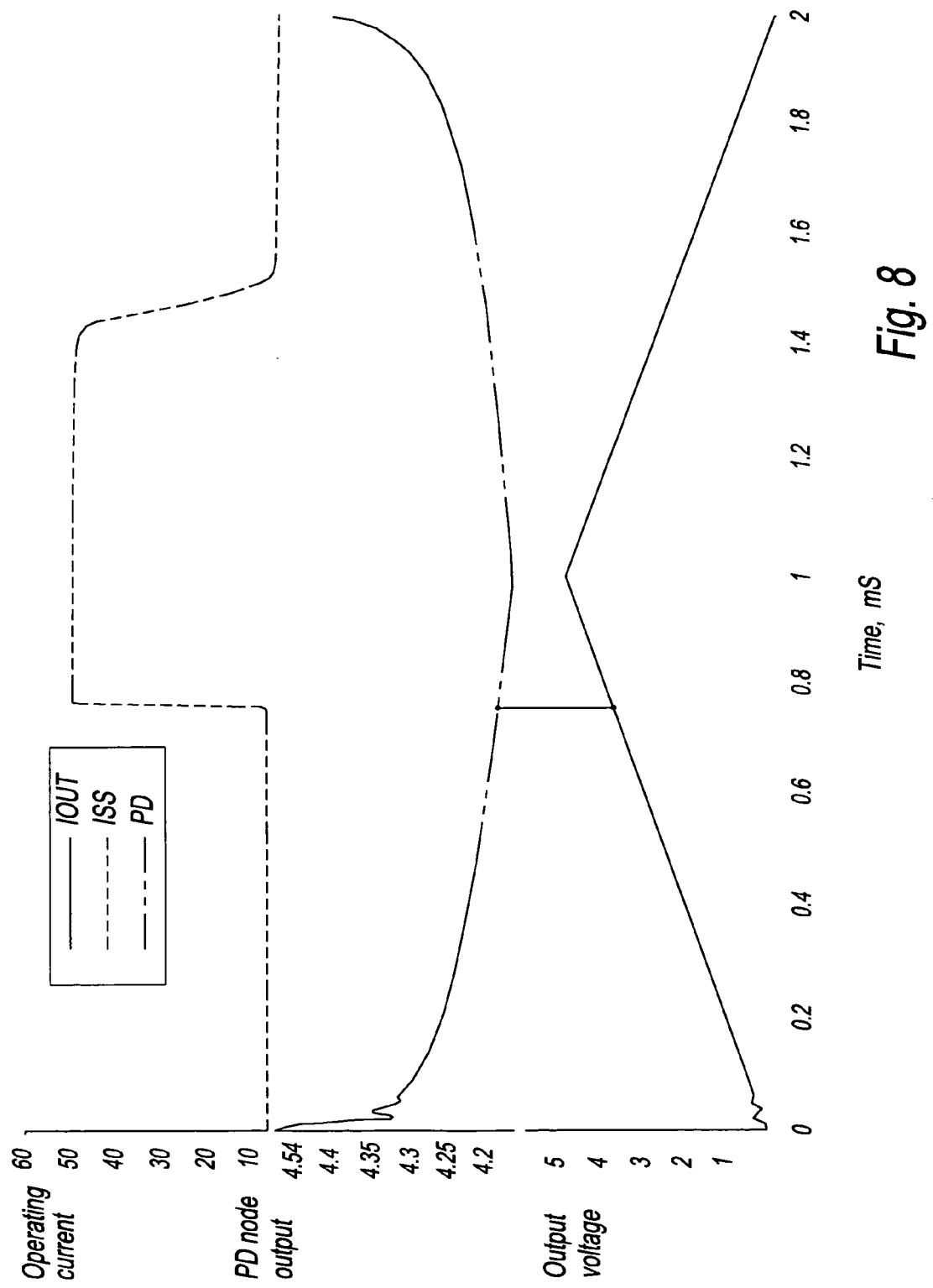
FIG. 8 is a waveform diagram showing the output characteristics, etc. when load current sweeps into the stabilized DC power supply circuit in FIG. 7.

FIG. 8 shows waveforms of the operating current Iss and the PD output on the differential amplifier U1 respectively when the load current of the regulator in FIG. 7 is changed from 0 to 5 mA. Hysteresis circuit U7 controls the system in such a way that when there is no load, P8 and P7 are in a non-conducting state, and when P5 conducts at a certain load current (4.5 mA in FIG. 8) and differential amplifier U1 enters a boost status, the boost status cannot be lifted when P8 and P7 are conducting, so as to reach a slightly lower load current (3.0 mA in FIG. 8). As a result, the system is kept from going back and forth between the boost status and the non-boost status and does not lapse into a oscillating state. Once the regulator enters boost mode from non-boost mode, the system stay in boost mode otherwise the load current decrease drastically to prevent oscillating or go and return between tow modes triggered by external noise.

Figure 9:
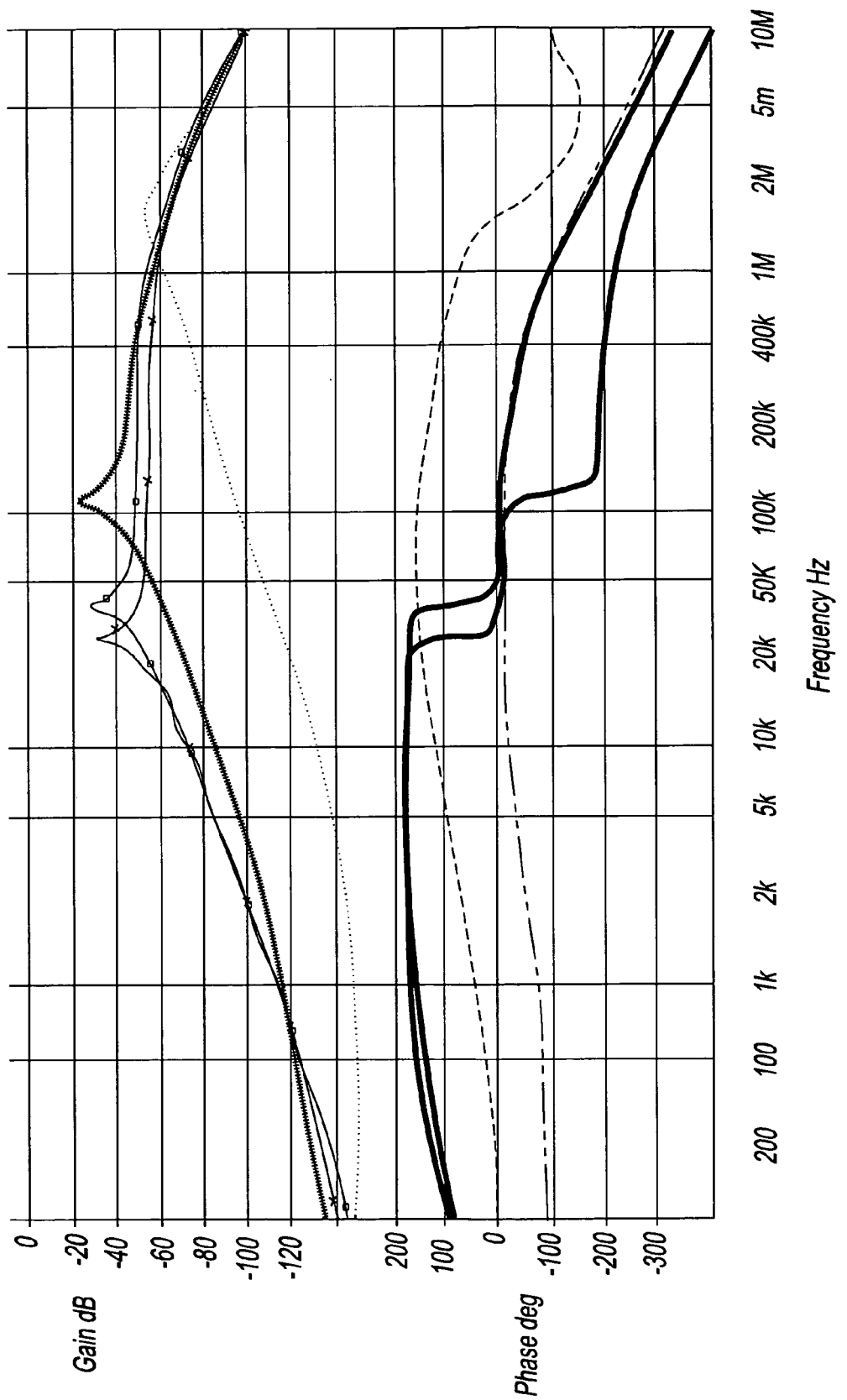
FIG. 9 is a graph showing the results of a simulation of the gain phase characteristics in the first embodiment of a stabilized DC power supply circuit.

FIG. 9 is a graph showing the results of a simulation of the gain phase characteristics of the power supply circuit of the first embodiment under changes in the load resistance RL. Load resistance RL was set at 200Ω, 1 kΩ, 10 kΩ, and 20 kΩ here. It is clear from these simulation results that the gain is 0 db or less, the phase rotation is 180° or less, and a stable operation can be guaranteed under any conditions.

Figure 10:
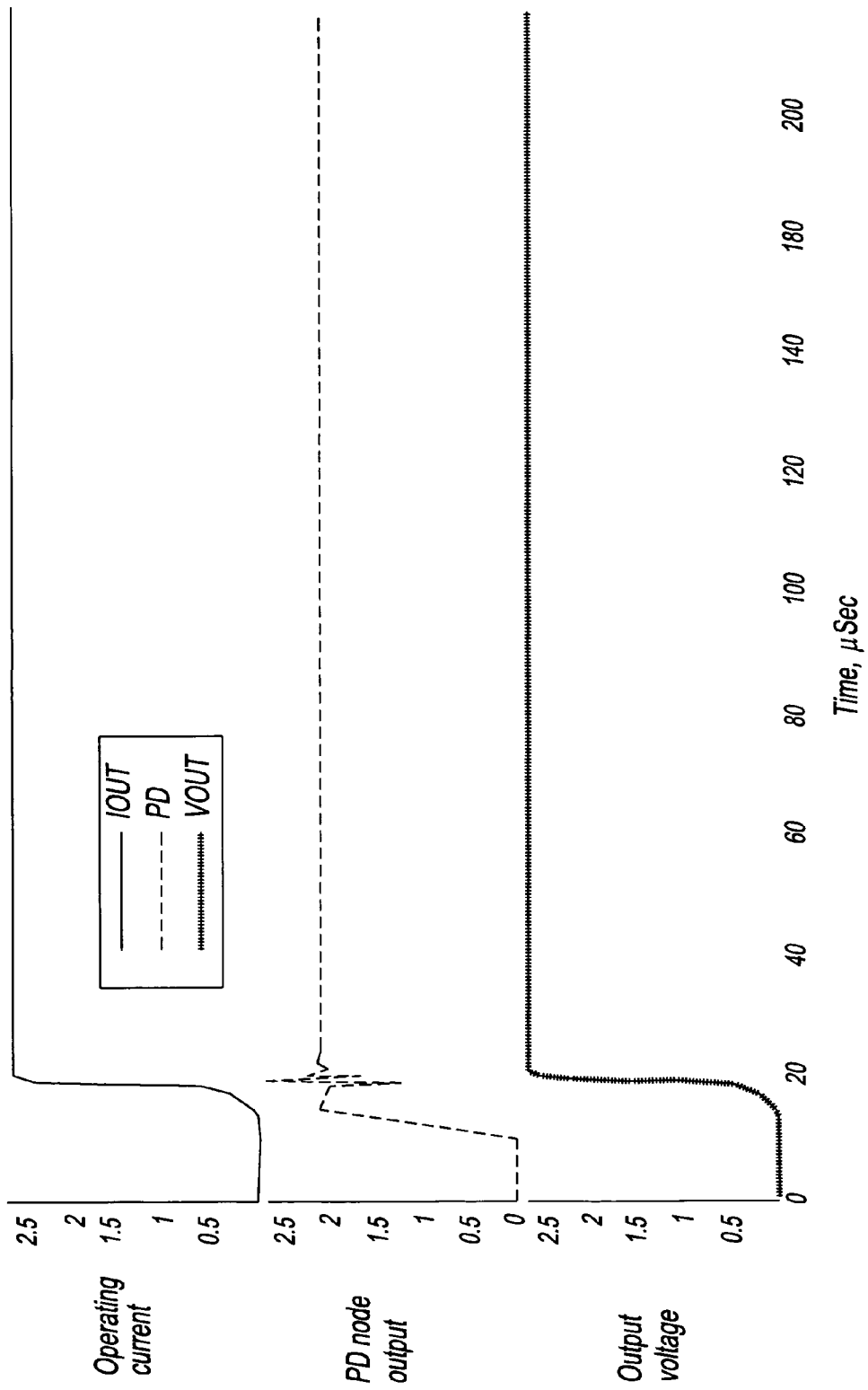
FIG. 10 is a waveform diagram showing the results of a simulation of transient response characteristics of the first embodiment of a stabilized DC power supply circuit.

FIG. 10 shows the simulation transient response waveform to step changes in the power supply voltage when RL=1 kΩ, where there is the least margin for boost status in FIG. 9. It is clear that there is no oscillation whatsoever and a stable operation can be guaranteed, even under conditions of a load resistance RL of 1 kΩ.

Figure 11:
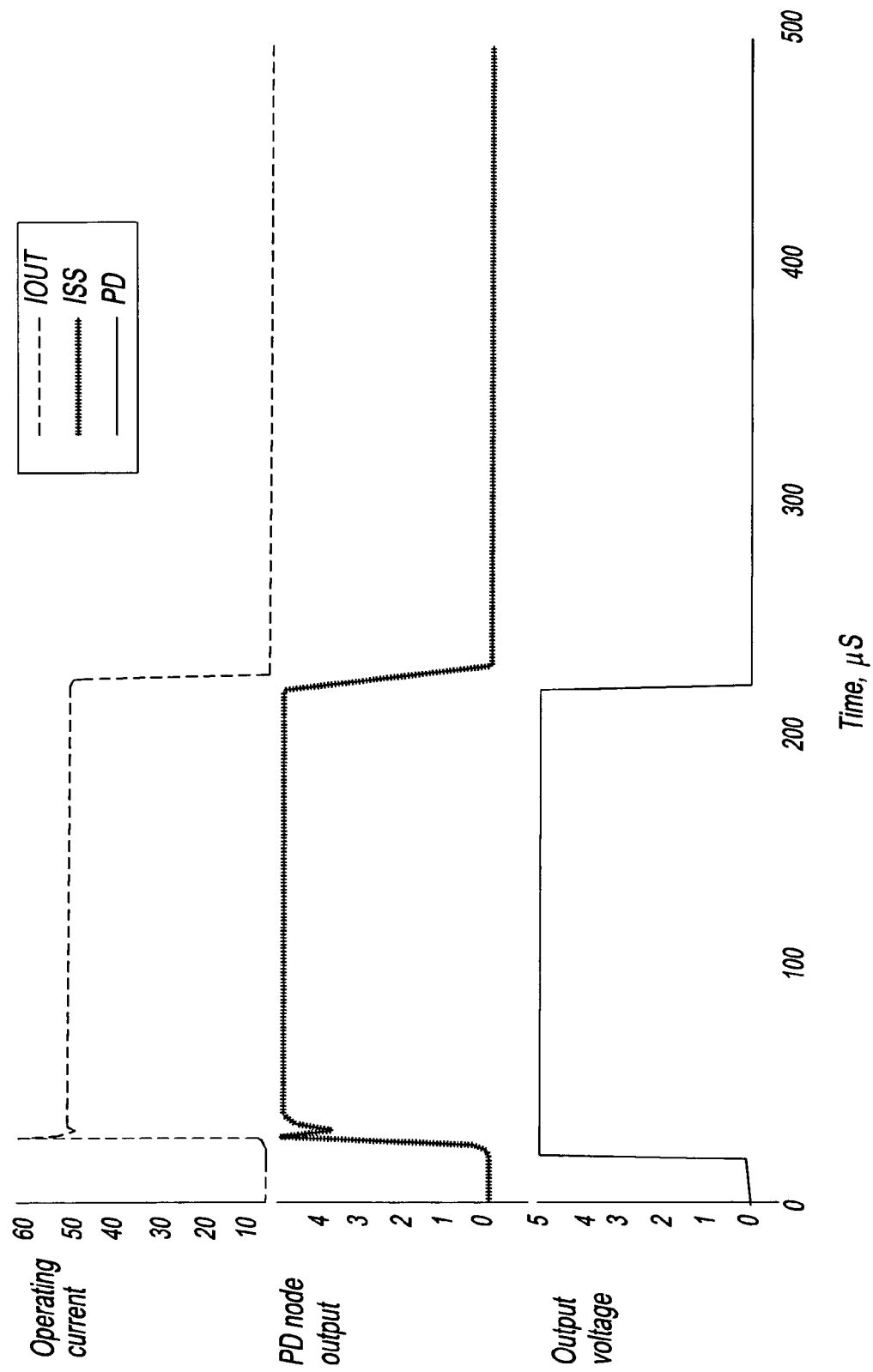
FIG. 11 is a graph showing the results of a simulation of the output waveform and the operating current waveform of an inverse amplifier of the first embodiment of a stabilized DC power supply circuit.

FIG. 11 is a graph showing the results of simulating the output waveform (waveform at the PF0 node) of inversion amplifier N5 and the operating current waveform when the load current in the power supply circuit of the first embodiment changed from 0 to 5 mA with a rise time of 1 μs. It is clear from these simulation results that there is no major interference with the waveform and the system operates without delay.

Figure 12:
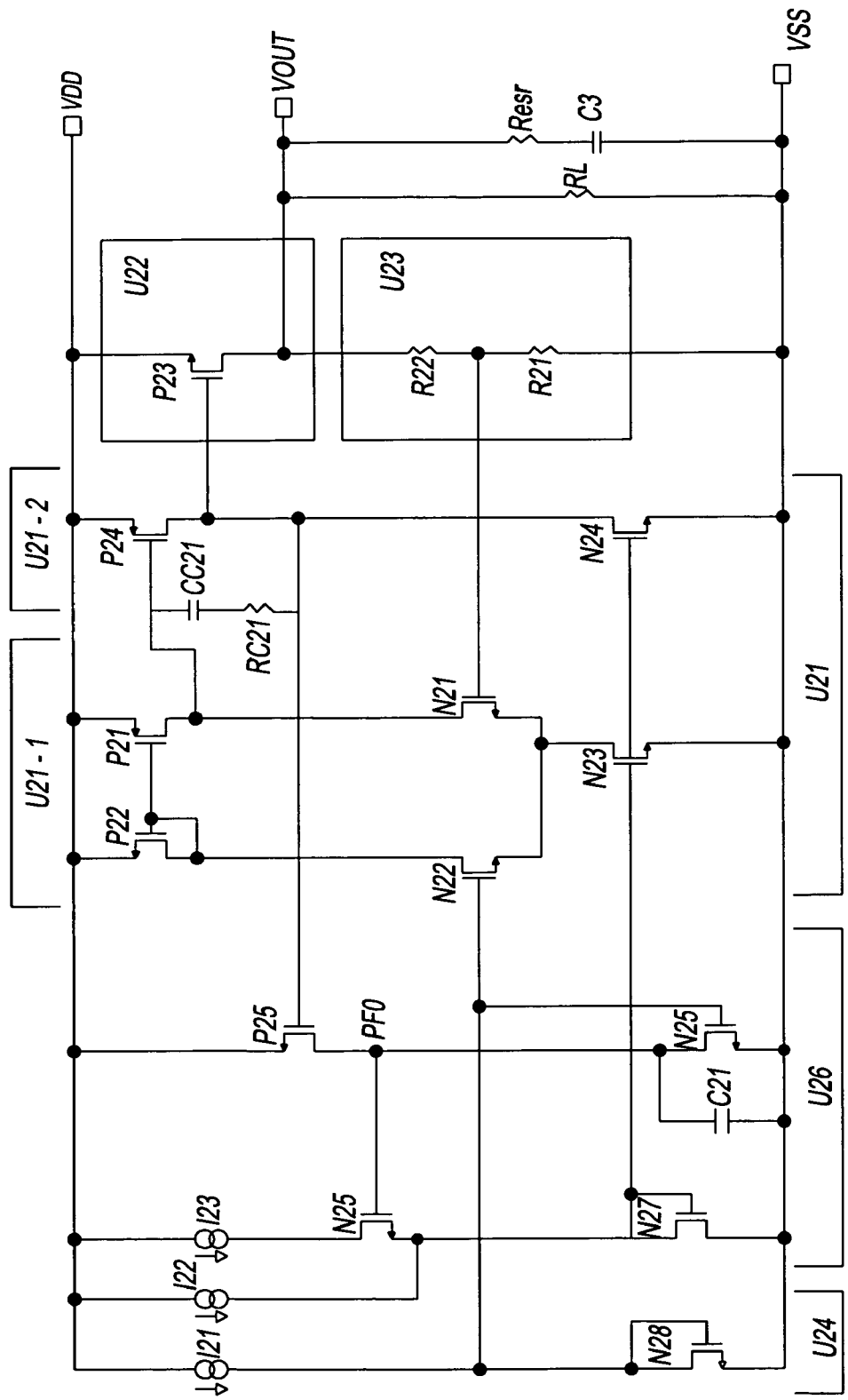
FIG. 12 is a specific circuit drawing showing a second embodiment of the stabilized DC power supply circuit of the present invention.

FIG. 12 is the basic circuit diagram showing a second embodiment of the stabilized DC power supply circuit of the present invention. Vdd (VDD) and Vss (VSS) in FIG. 12 are the power supply terminals.

The stabilized DC power supply circuit in FIG. 12 comprises a differential amplifier U21, an output amplification circuit U22, an output voltage dividing circuit U23, a reference voltage circuit U24, and an adaptive control bias current boost circuit U26. Of these structural elements, differential amplifier U21, output amplification circuit U22, output voltage dividing circuit U23, and reference voltage circuit U24 have the same structure as differential amplifier U41, output amplification circuit U42, output voltage dividing circuit U43, and reference voltage circuit U44 of the conventional power supply circuit shown in FIGS. 1 and 2. In essence, differential amplifier U21 operates in such a way that it amplifies the difference in voltage between reference voltage circuit U24 and voltage dividing circuit U23 and applies that voltage to output circuit U22 to control an output transistor P23 of output circuit U22 to cause a constant output voltage Vout to be output. At this time, adaptive control bias current boost circuit U26 operates in accordance with the load current flowing to the RL and increases the bias current of differential amplifier U21.

Adaptive control bias current boost circuit U26 has a bias generating circuit composed of inversion amps N25 to N27 and a constant-current source I23, and by using a capacitor C21 having a large capacity, creates a large delay and produces a pseudo-hysteresis operation.

Specifically, an inversion amplification circuit having a delay circuit is formed inside adaptive control bias current boost circuit U26. This inversion amplification circuit has an inverter circuit consisting of a P channel MOSFET (first transistor) P25 and an N channel MOSFET (second transistor) N25 connected to the output of differential amplifier U21. The output of the inverter circuit is connected to capacitor C21. Moreover, the time constant of the circuit formed by N channel MOSFET (second transistor) N25 and capacitor C21 is at least ten times the time constant of the circuit formed by P channel MOSFET (first transistor) P25 and capacitor C21.

Figure 13:
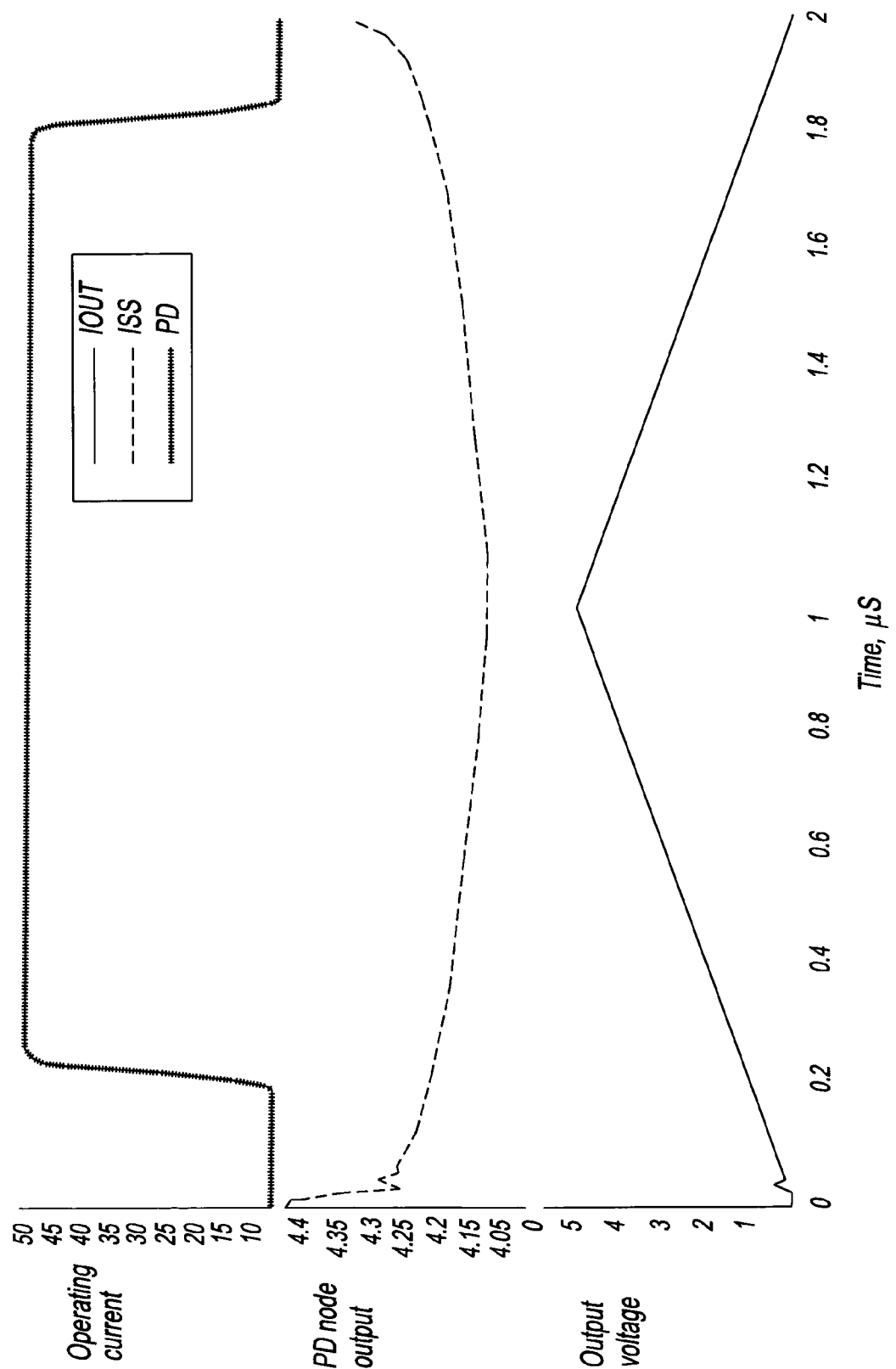
FIG. 13 is a waveform diagram showing the output characteristics, etc. when load current sweeps into the stabilized DC power supply circuit in FIG. 12.

FIG. 13 shows the operating current Iss when load current swept at 0 to 5 mA into the power supply circuit of FIG. 12, as well as the waveform of the output PD of differential amplifier U1. When there is no load, P25 is in a non-conducting state, and when P25 conducts at a certain load current (1.1 mA in FIG. 13), differential amplifier U21 enters the boost status. The load current Iout decreases and the boost status is lifted when it becomes 0.8 mA or less. A long delay time is applied in order to move from the boost status to the non-boost status in the second embodiment and the effect is therefore the same as when the system displays pseudo-hysteresis. This prevents subjecting the system to oscillation. Simulation has shown that a stable operation is realized as long as the time it takes to return from the boost status to the non-boost status is at least ten times the time it takes to move from the non-boost status to the boost status. A delay time is created by capacitor C21 in FIG. 12. However, this is junction capacity here, but it can also be MOS capacity. There are no restrictions relative to the method for creating capacity.

Figure 14:
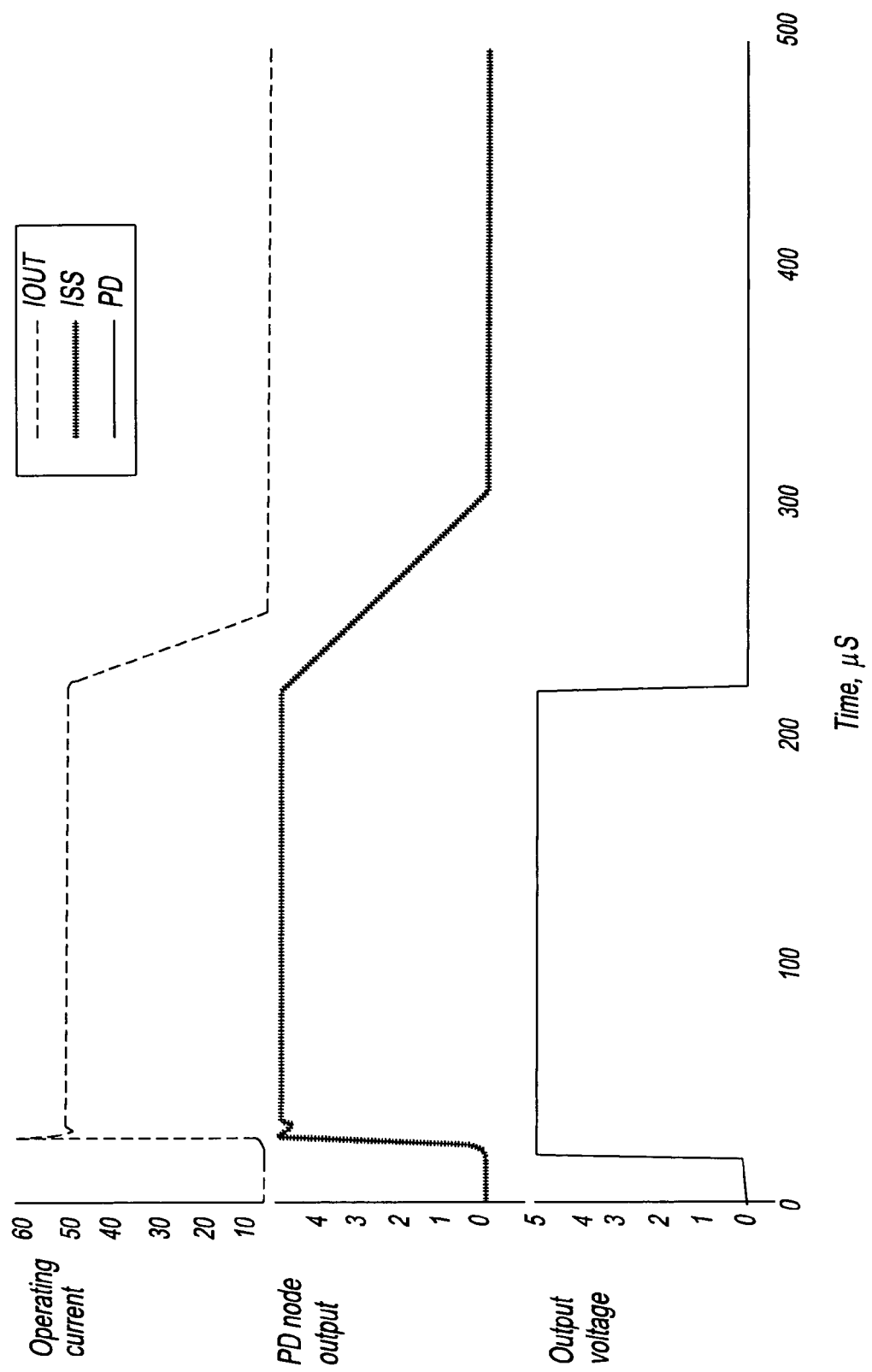
FIG. 14 is a graph showing the results of a simulation of the output waveform and the operating current waveform of the inverse amplifier of the stabilized DC power supply circuit of the second embodiment.

FIG. 14 is a graph showing the results of simulating the output waveform (output waveform of PFO node) of inversion amp N5 when the load current is changed from 0 to 5 mA with a rise time of 1 μs in the power supply circuit of the second embodiment and the operating current waveform. Although there is no delay in the rise, a delay time of approximately 100 times (approximately 100μs) is observed in the fall time.

Figure 15:
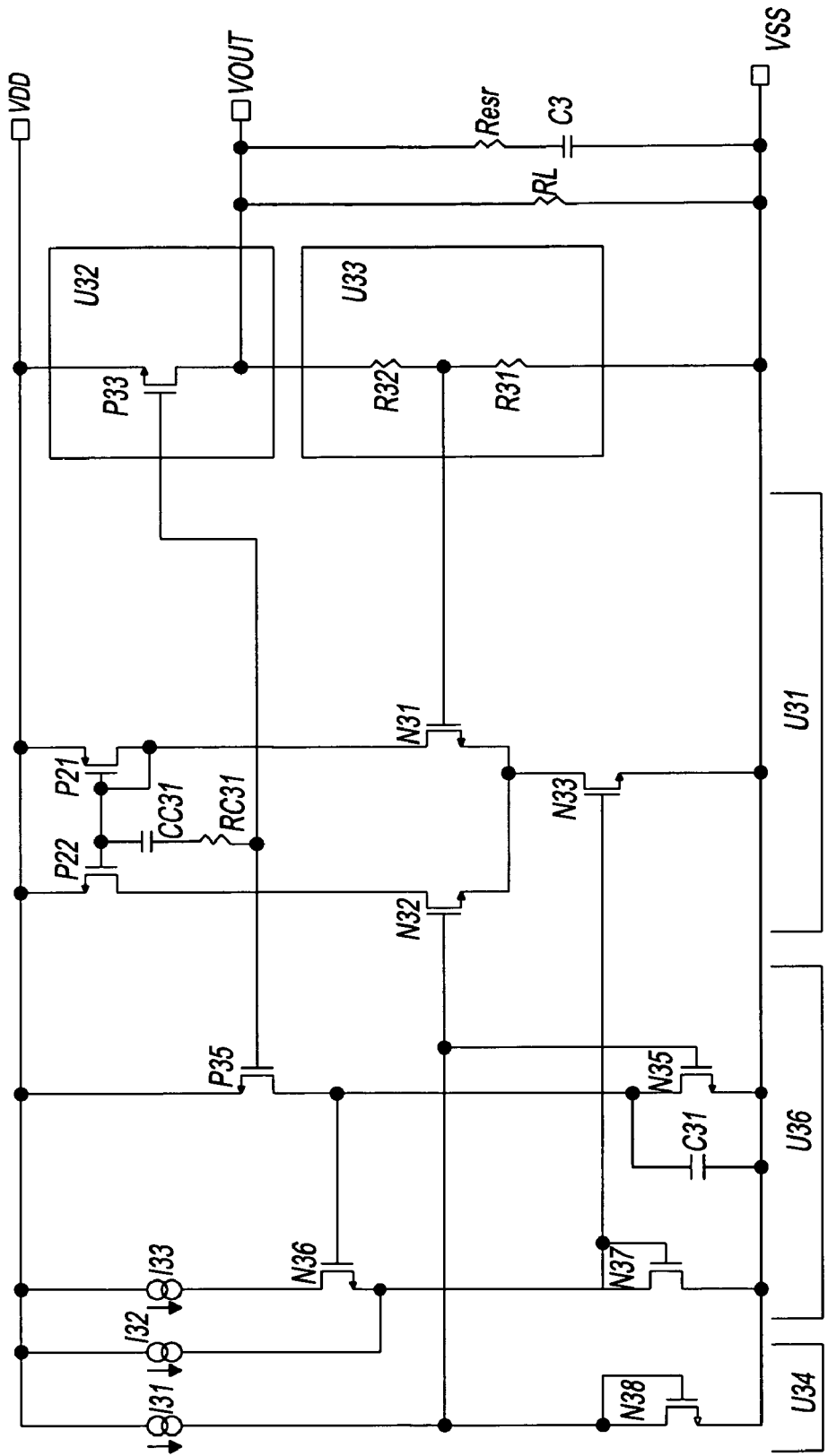
FIG. 15 is a specific circuit drawing showing a third embodiment of the stabilized DC power supply circuit of the present invention.

FIG. 15 is a concrete circuit diagram showing a third embodiment of the stabilized DC power supply circuit of the present invention. Vdd (VDD) and Vss (VSS) in FIG. 15 are the power supply terminals.

The stabilized DC power supply circuit shown in FIG. 15 comprises a differential amplifier U31, an output amplification circuit U32, an output voltage dividing circuit U33, a reference voltage circuit U34, and an adaptive control bias current boost circuit U36. Of these structural elements, differential amplifier U31, output amplification circuit U32, output voltage dividing circuit U33, and reference voltage circuit U34 have the same structure as differential amplifier U41, output amplification circuit U42, output voltage dividing circuit U43, and reference voltage circuit U44 of the conventional power supply circuit shown in FIGS. 1 and 2. In essence, differential amplifier U31 operates in such a way that it amplifies the difference in voltage between reference voltage circuit U34 and voltage dividing circuit U33 and applies that voltage to output circuit U32 to control output transistor P33 of output circuit U32 and to cause a constant output voltage Vout to be output. Adaptive control bias current boost circuit U36 operates in accordance with the load current flowing to the RL and increases the bias current of differential amplifier U31.

Adaptive control bias current boost circuit U36 has a bias generating circuit composed of inversion amps N35 to N37 and constant-current source I33, and by using a capacitor C31 having a large capacity, creates a large delay and produces a pseudo-hysteresis operation in a manner similar to a second embodiment.

Specifically, an inversion amplification circuit having a delay circuit is formed inside adaptive control bias current boost circuit U36. This inversion amplification circuit has an inverter circuit consisting of a P channel MOSFET (first transistor) P35 and an N channel MOSFET (second transistor) N35 connected to the output of differential amplifier U31. The output of the inverter circuit is connected to capacitor C31. Moreover, the time constant of the circuit formed by N channel MOSFET (second transistor) N35 and capacitor C31 is at least ten times the time constant of the circuit formed by P channel MOSFET (first transistor) P35 and capacitor C31.

By means of the third embodiment as well, a large delay time is applied in order to shift from the boost to the non-boost status; therefore, pseudo-hysteresis is obtained and the system is prevented from being subjected to oscillation.

As previously described, the present invention completely solves the unstable operation of adaptive control bias current boost circuits that has been a problem with conventional stabilized DC power supply circuits. In essence, by means of the present invention, a stable operation is realized by adding a hysteresis function, or a pseudo-hysteresis function using a large delay element, to the feedback loop of an adaptive control bias current boost circuit. The hysteresis or pseudo-hysteresis in the feedback loop is realized by a relatively simple circuit structure and good, reliable results are obtained. The structure of the stabilized DC power supply circuit of the present invention is a novel one that has not existed until now.

It should be noted that the transistor in the above-mentioned embodiment is a CMOS-FET, but it is also possible to use another type of semiconductor element, such as a bipolar transistor, a silicon germanium transistor, or a thin film TFT transistor.

The invention claimed is:

1. A stabilized DC power supply circuit, characterized in having,
    between first and second electrode terminals, which introduce power supply voltage,
    a reference voltage generating circuit, which generates a reference voltage; a voltage dividing circuit, which generates another reference voltage;
    a differential amplifier, which amplifies the voltage difference between the reference voltages;
    a voltage current output circuit, which is controlled by the differential amplifier in order to produce a stabilized output voltage;
    an output voltage dividing circuit, which detects output voltage changes; and
    a bias current boost circuit, which is controlled by the load current flowing from the voltage current output circuit and is connected to the differential amplifier,
    wherein the bias current boost circuit comprises
    an inverse amplification circuit exhibiting hysteresis;
    a first bias current generating circuit, which always supplies constant current; and
    a second bias current generating circuit, which is controlled by the inverse amplification circuit exhibiting hysteresis, and
    is designed such that the load current under which the second bias current generating circuit switches to the non-conducting state is lower than the load current under which the second bias current generating circuit is in the conducting state.

2. The stabilized DC power supply circuit according to claim 1, further characterized in that
the inverse amplification circuit exhibiting hysteresis has first and second transistors, which are connected to the output of the differential amplifier;
the first and second transistors work with a third transistor to form a first inverter circuit;
there is a second inverter circuit formed from a fourth transistor, which is connected to the output of the first inverter circuit, and a constant current power supply; and
a fifth transistor connected to the output thereof is connected to the second transistor.

3. A stabilized DC power supply circuit, characterized in having,
between first and second electrode terminals, which introduce power supply voltage,
a reference voltage generating circuit, which generates a reference voltage; a voltage dividing circuit, which generates another reference voltage;
a differential amplifier, which amplifies the voltage difference between the reference voltages;
a voltage current output circuit, which is controlled by the differential amplifier in order to produce a stabilized output voltage;
an output voltage dividing circuit, which detects output voltage changes; and
a bias current boost circuit, which is connected to the differential amplifier,
wherein the bias current boost circuit comprises
an inverse amplification circuit having a delay circuit;
a first bias current generating circuit, which always supplies constant current; and
a second bias current generating circuit, which is controlled by the inverse amplification circuit having a delay circuit, and
is designed such that the delay time by which the second bias current generating circuit is switched to the non-conducting state is at least ten times greater than the delay time by which the second bias current generating circuit is in the conducting state.

4. The stabilized. DC power supply circuit according to claim 3, further characterized in that
the inverse amplification circuit having the delay circuit comprises a first transistor, which is connected to the output of the differential amplifier;
the first transistor works with the second transistor to form an inverter circuit;
the output of the inverter circuit is connected to a capacitor; and
the time constant of the circuit formed by the second transistor and the capacitor is at least ten times the time constant of the circuit formed by the first transistor and the capacitor.

* * * * *